(12) United States Patent
Convertino et al.

(10) Patent No.: US 11,621,340 B2
(45) Date of Patent: Apr. 4, 2023

(54) FIELD-EFFECT TRANSISTOR STRUCTURE AND FABRICATION METHOD

(71) Applicant: International Business Machines Corporation, Armonk, NY (US)

(72) Inventors: Clarissa Convertino, Zurich (CH); Cezar Bogdan Zota, Zurich (CH); Lukas Czornomaz, Zurich (CH); Kirsten Emilie Moselund, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/681,141

(22) Filed: Nov. 12, 2019

(65) Prior Publication Data

US 2021/0143263 A1 May 13, 2021

(51) Int. Cl.
*H01L 29/66* (2006.01)
*H01L 29/16* (2006.01)
*H01L 29/08* (2006.01)

(52) U.S. Cl.
CPC .... *H01L 29/66431* (2013.01); *H01L 29/0895* (2013.01); *H01L 29/16* (2013.01); *H01L 29/66545* (2013.01)

(58) Field of Classification Search
CPC ......... H01L 29/66431; H01L 29/66545; H01L 29/0895; H01L 29/16; H01L 29/7311;
(Continued)

(56) References Cited

U.S. PATENT DOCUMENTS

| 4,962,054 A * | 10/1990 | Shikata ............. H01L 29/66878 438/179 |
| 8,368,127 B2 * | 2/2013 | Zhu ..................... H01L 29/7606 257/288 |

(Continued)

FOREIGN PATENT DOCUMENTS

WO 2018063302 A1 4/2018

OTHER PUBLICATIONS

Memisevic et al., "Vertical InAs/GaAsSb/GaSb Tunneling Field-Effect Transistor on Si with S = 48 mV/decade and Ion = 10 µA/µm for Ioff = 1 nA/µm at VDS = 0.3 V," IEEE International Electron Devices Meeting (IEDM), Dec. 2016, pp. 1-4.

(Continued)

*Primary Examiner* — Natalia A Gondarenko
(74) *Attorney, Agent, or Firm* — Grant M. McNeilly (57) ABSTRACT

The present disclosure relates to a method for fabricating a field-effect transistor structure on a substrate. The method includes forming a first semiconductor structure on the substrate, forming above the first semiconductor structure a gate structure that comprises a spacer layer laterally terminating the gate structure and has a lower etch rate than the first semiconductor structure with respect to a predetermined etchant, forming an undercut below the spacer layer by recessing the first semiconductor structure using the etchant, the undercut extending laterally below the spacer layer by not more than the thickness of the spacer layer, forming on the first semiconductor structure a second semiconductor structure filling the undercut, and forming a third semiconductor structure above the first semiconductor structure, wherein one of the second and third semiconductor structures forms the source of the field-effect transistor structure and the other one forms the drain.

17 Claims, 4 Drawing Sheets

(58) Field of Classification Search
CPC ............ H01L 29/78624; H01L 29/802; H01L
29/8126; H01L 21/823468; H01L
21/823864; H01L 21/823418; H01L
21/823814; H01L 21/823475; H01L
21/302; H01L 21/321138; H01L
21/306–30621; H01L 21/28132; H01L
21/28141; H01L 29/0649; H01L 29/083;
H01L 29/0834; H01L 29/165; H01L
29/513; H01L 29/516; H01L 29/7883;
H01L 29/78696; H01L 29/41775; H01L
29/41783; H01L 29/4232; H01L
29/66636; H01L 29/66553; H01L
29/66659; H01L 29/66356; H01L
29/6656; H01L 29/66689; H01L
29/66696; H01L 29/66719; H01L
29/66727; H01L 29/66977; H01L
21/2053; H01L 29/0847; H01L 29/167;
H01L 29/7391; H01L 29/7848; H01L
29/7834; H01L 21/02579; H01L 21/0262
USPC ............ 257/396, 288, 280, 192, 77, E21.19,
257/E29.255; 438/285, 195, 172, 595
See application file for complete search history.

(56) References Cited

U.S. PATENT DOCUMENTS

| | | | |
|---|---|---|---|
| 8,697,510 | B2 | 4/2014 | Bhuwalka et al. |
| 8,835,267 | B2 * | 9/2014 | Lee .................... H01L 29/0847 257/190 |
| 9,530,863 | B1 | 12/2016 | Zhang et al. |
| 9,640,667 | B1 | 5/2017 | Balakrishnan |
| 9,722,048 | B1 | 8/2017 | Balakrishnan |
| 9,806,172 | B2 | 10/2017 | Chuang et al. |
| 10,236,344 | B2 | 3/2019 | Alptekin et al. |
| 10,276,663 | B2 * | 4/2019 | Chen .................... H01L 29/0847 |
| 10,388,772 | B2 * | 8/2019 | Liu .................... H01L 29/0834 |
| 10,529,860 | B2 * | 1/2020 | Chen ............... H01L 21/823814 |
| 2006/0043498 | A1 * | 3/2006 | Orlowski .......... H01L 29/66636 257/396 |
| 2009/0302348 | A1 * | 12/2009 | Adam ..................... H01L 29/78 257/190 |
| 2010/0038713 | A1 | 2/2010 | Majhi et al. |
| 2011/0253981 | A1 | 10/2011 | Rooyackers et al. |
| 2011/0278670 | A1 | 11/2011 | Loh et al. |
| 2012/0326168 | A1 * | 12/2012 | Adam ............... H01L 29/78687 257/77 |
| 2013/0037866 | A1 * | 2/2013 | Thees ............. H01L 21/823468 257/288 |
| 2014/0145246 | A1 * | 5/2014 | Ning ................. H01L 29/66848 257/280 |
| 2015/0243707 | A1 | 8/2015 | Park |
| 2015/0287826 | A1 * | 10/2015 | Cheng .................... H01L 29/16 257/20 |
| 2016/0056033 | A1 * | 2/2016 | Sardashti ............ H01L 21/0228 438/763 |
| 2017/0125544 | A1 * | 5/2017 | Leobandung ..... H01L 29/66742 |
| 2017/0162446 | A1 | 6/2017 | Balakrishnan |
| 2018/0190802 | A1 | 7/2018 | Yang et al. |
| 2018/0269329 | A1 | 9/2018 | Balakrishnan |
| 2019/0341453 | A1 * | 11/2019 | Sung ..................... H01L 29/772 |

OTHER PUBLICATIONS

Avci et al., "Tunnel Field-Effect Transistors: Prospects and Challenges," Journal of the Electron Devices Society, vol. 3, No. 3, May 2015, pp. 88-95.
Schenk et al., "The Impact of Hetero-junction and Oxide-interface Traps on the Performance of InAs/Si FETS," 17th International Workshop on Junction Technology (IWJT), Jun. 2017, pp. 27-30.
Chattopadhyay et al., "Impact of a Spacer Dielectric and a Gate Overlap/Underlap on the Device Performance of a Tunnel Field-Effect Transistor," IEEE Transactions on Electron Devices, vol. 58, No. 3, Mar. 2011, pp. 677-683.
Convertino et al., "Field-Effect Transistor Structure and Fabrication Method," U.S. Appl. No. 16/681,225, filed Nov. 12, 2019.
List of IBM Patents or Patent Applications Treated as Related, Signed Nov. 12, 2019, 2 pages.

* cited by examiner

FIELD-EFFECT TRANSISTOR STRUCTURE AND FABRICATION METHOD

BACKGROUND

The present disclosure relates to semiconductor devices, and more particularly, to field-effect transistors and methods for producing the same.

The previous decades have seen a continuous effort of scaling the dimensions of microelectronics down to ever smaller technology nodes. This scaling is accompanied by power scaling toward more energy-efficient microelectronics.

The current-voltage (I-V) curves of classical MOSFET devices feature a so-called subthreshold swing with a slope of approximately 60 millivolts per decade (mV/dec) at 300 Kelvin (K) or more. The subthreshold leakage current responsible for the subthreshold swing is a major contributor to the off-state current and therefore sets a lower limit to the power consumption of such devices. As the value of 60 mV/dec is a fundamental lower limit for MOSFETs implementing thermal generation of charge carriers (electrons, holes), the power design of these devices cannot be scaled beyond this limit. Furthermore, the subthreshold swing is proportional to the transistor speed: The lower the subthreshold swing, the faster a transistor will be able to charge its fan-out (consecutive capacitive load).

Tunnel field-effect transistors (TFETs) are expected to overcome the limits of classical MOSFETs by replacing the classical thermionic emission of charge carriers over a potential barrier by an injection through a tunneling barrier. From an energy point of view, the high-energy tail of the Fermi function should be cut off for an ideal TFET, which is expected to result in a very steep I-V slope and a very low power consumption during operation. So far, no high-performance III-V based TFET with a CMOS-compatible process flow has been demonstrated yet due to the process complexity combined with a sensitivity on defects that is typical for TFETs. In order to enable the use of a standard replacement-metal-gate process for TFET technology, the precision of the gate alignment with respect to the source-channel and drain-channel junctions and the gain of control over defects within the junctions must be addressed.

SUMMARY

Embodiments of the present disclosure include a method for fabricating a field-effect transistor structure on a substrate. The method includes forming a first semiconductor structure on the substrate and forming a gate structure above the first semiconductor structure. The gate structure includes a spacer layer terminating the gate structure in a lateral direction of the gate structure. The spacer layer includes a lower etch rate than the first semiconductor structure in response to being etched with a predetermined etchant, and a first exposed surface of the first semiconductor structure being uncovered by the gate structure. The method further includes starting from the first exposed surface, forming an undercut below the spacer layer by recessing the first semiconductor structure using the etchant. The undercut extends in the lateral direction below the spacer layer by less than or equal to the thickness of the spacer layer. The method also includes forming on the recessed first semiconductor structure a second semiconductor structure filling the undercut, and forming a third semiconductor structure above the first semiconductor structure. One of the second and third semiconductor structures forming the source of the field-effect transistor structure and the other one forming the drain of the field-effect transistor structure.

Embodiments of the present disclosure may have the advantage of allowing for a precise positioning of the junction between the first and the second semiconductor structure relative to the gate structure. In particular, the undercut below the spacer layer of the gate structure is formed by a means of an etching process that may be controlled with a high precision. The etch process makes use of a predetermined etchant and the response of the first semiconductor structure to this etchant is known to be faster than that of the spacer layer. Hence, by precisely controlling the etch depth of the etchant, the formation of the undercut may be stopped before it proceeds beyond alignment with the interface between the spacer layer and the internal of the gate structure (for instance, an electrically conductive gate electrode surrounded by a high-k dielectric layer) that is covered by the spacer layer (preferably, an electrically nonconductive material). In this way, an overlap between the second semiconductor structure and the gate of the FET structure may be avoided. It may be possible to manufacture the FET structure with a self-aligned gate. With a suitable known or future etching process, the method may allow for placing the heterojunction in a controlled manner with a precision of single nanometers, which may provide dimensional margins for a miniaturization of the FET structure. At the same time, the lower etch rate of the spacer layer may ensure that the formation of the undercut in the first semiconductor structure does not damage the portion of the gate structure covered by the spacer layer.

It may be possible for the FET structure to come closer to the theoretical limit of a subthreshold slope of 60 millivolts per decade (mV/dec) at 300 Kelvin (K) if the FET structure implements a MOSFET with thermal charge carrier generation, or respectively, to obtain a 'sub-thermionic' subthreshold slope of less than 60 mV/dec if the FET structure implements a tunnel field-effect transistor (TFET) device featuring charge carrier injection by tunneling. This has been confirmed by simulations of TFET devices conducted at ETH Zurich and is also consistent with recent experimental results that indicate that the subthreshold swing reacts sensitively to the position of the tunnel junction. A reduction of the subthreshold swing is expected to lead to a higher switching speed and a lower power consumption of such TFET devices. The most promising results were simulated for devices with a source-gate overlap of 0 nanometers (nm).

Moreover, it may be possible to manufacture the second semiconductor structure, and optionally also the third semiconductor structure, with an underlap, i.e., an ungated region of channel of, e.g., a few to a few tens of nanometers adjacent to either the source or the drain. This may be advantageous, e.g., on the drain side of a TFET to reduce the leakage current caused by ambipolar transport. In summary, it may be possible to design the FET structure so as to implement an FET or a TFET with a source-gate and/or drain-gate geometry having an overlap of 0 nm or an underlap. In addition, it may be possible to control the electrostatic interaction between the second semiconductor structure and the gate structure by choosing the thickness of the spacer layer that defines the distance between the gate structure and any portions of the second semiconductor structure in the lateral direction. It may also be possible to form said overlap of 0 nm or said underlap only for the second semiconductor structure, while the third semiconductor structure may overlap with the part of the gate structure that is covered by the spacer layer. If, for example, the second semiconductor structure incorporates the source of the TFET structure and the third semiconductor structure incorporates its drain, then a small controlled overlap between the drain and the gate electrode may increase the line-tunneling component of the number of charge carriers that are injected into the channel through the drain.

Embodiments of the present disclosure may have the further advantage of offering an increased flexibility of material choice because it may be possible to form some, or all of the structures described herein independent of the particular choice of material for one or more of the structures incorporated by the FET structure. The second and third semiconductor structures may be grown on or above the first semiconductor structure, so it may be unnecessary to make use of an implantation process for doping the second and third semiconductor structures, which would compromise the self-alignment. The formation of the heterojunctions of the second and third semiconductor structures may not be restricted to a special material combination, and it may be possible to form n-type and p-type implementations of the FET structure on the same substrate. Therefore, embodiments may enable the manufacturing of a TFET device in a CMOS-compatible replacement-metal-gate process.

According to an embodiment, the method further includes covering the first semiconductor structure with a semiconductor layer. The semiconductor layer includes a lower etch rate than the first semiconductor structure in response to being etched with the etchant. The gate structure is formed on the semiconductor layer. The method further includes exposing the first exposed surface by removing a portion of the semiconductor layer uncovered by the gate structure.

This may have the effect that the undercut is formed below the spacer layer between the semiconductor layer and the first semiconductor structure. Thus, the semiconductor layer may fulfill several advantageous functions. The semiconductor layer may form a detaching interface of the gate structure from the first semiconductor structure and the portion of the second semiconductor structure filling the undercut. This may allow for arranging the second semiconductor structure at a predefined distance from the gate structure not only horizontally (by means of the lateral extension of the undercut), but also vertically (by means of the thickness of the second semiconductor structure). This may enable an improved control of the electrostatic interaction between the second semiconductor structure and the gate structure and may decrease the probability of charge carrier loss by tunneling between the second semiconductor structure and the gate structure. If a second undercut is present on the opposite lateral side of the gate structure and filled by the third semiconductor structure, the same holds for the distance between the gate structure and the third semiconductor structure.

Furthermore, the semiconductor layer may also protect the first semiconductor structure from adverse influences of manufacturing steps related to structures that adjoin the first semiconductor structure, such as a formation of the gate structure in a replacement-gate process and may introduce a greater flexibility of designing the first semiconductor structure as a channel region of the FET structure. For example, the semiconductor layer and the first semiconductor structure may be made of materials having different band gaps so that the band gap of material adjoining the gate structure may be chosen, e.g., to provide an improved suppression of undesirable effects such as leakage due to gate tunneling, while the band gap of the material chosen for the first semiconductor structure may be optimized with respect to charge carrier transport and injection. In an example, the first semiconductor structure is made of silicon (Si) and the semiconductor layer is made of silicon-germanium (SiGe). In another example, the first semiconductor structure is made of an III-V compound semiconductor such as gallium arsenide (GaAs) and the semiconductor layer is made of a suitable different III-V compound semiconductor such as indium gallium arsenide (InGaAs). The semiconductor layer may be formed on the first semiconductor structure by known means such as deposition or epitaxial growth.

In response to being etched with the predetermined etchant, the semiconductor layer has a lower etch rate than the first semiconductor structure. Similar to the spacer layer of the gate structure, this may enable a precise lateral structuring of the undercut (and thus a precise placement of the junction between the first and the second semiconductor structure) and may ensure at the same time that the second semiconductor structure stays vertically detached from the gate structure. This may reduce the risk of charge carrier leakage between the second semiconductor structure and the gate structure. It may be advantageous to manufacture the semiconductor layer with a smaller thickness than the first semiconductor structure in order to provide a sufficient channel volume for charge carrier storage and transport while shortening the path length of the charge carriers before getting injected into the first semiconductor structure.

According to an embodiment, the semiconductor layer has a lower interface trap density with respect to the gate structure than the first semiconductor structure. The interface trap density $D_{IT}$ characterizes the number of charge carrier traps (such as lattice defects or localized phonons) per volume of a given material that are accidentally created as a result of the manufacturing or presence of an adjoining structure interfacing the given material. As traps may deteriorate both the storage and the transport capacities of an FET channel, it is desirable to have a low trap density throughout the whole channel Interfaces to adjacent structures may be especially prone to defectivity, e.g. if the formation of the adjacent structure involves a harsh process such as etching or if the crystal structure and/or the atomic composition of the adjacent structure differs strongly from that of the given material, as it may be the case for the transition between an intrinsic semiconductor channel and the high-k dielectric layer of a gate structure.

This illustrates that the design principle of an improved material compatibility may be contrary to the performance requirements for an FET channel. However, by selecting a suitable material that, e.g., is structurally and chemically similar to the first semiconductor structure (so that the number of charge traps induced into the first semiconductor structure by the interface between the first semiconductor structure and the semiconductor layer may be negligible compared to a direct contact between the first semiconductor structure and the gate structure) and is known to have a smaller interface trap density $D_{IT}$ with respect to the portion of the gate structure facing the first semiconductor structure, the semiconductor layer may allow for distributing the contrary requirements to different materials, so the semiconductor layer may serve as a compatibility layer between the gate structure and the first semiconductor structure.

According to an embodiment, the first semiconductor structure has a higher charge carrier mobility and/or a lower effective charge carrier mass than the semiconductor layer. This may increase the source-drain current through the first semiconductor structure in response to a predetermined bias pattern and may decrease the switching cycle times of an FET device utilizing the FET structure. At the same time, charge carrier mobility may be less important for the optimization of the semiconductor layer, which may be focused more strongly on reaching a good compatibility to the material(s) of the gate structure facing the first semiconductor structure. Therefore, the charge carrier mobility (or the effective mass of the charge carriers, which is usually inversely proportional to the charge carrier mobility) may be a beneficial quantity for optimizing the performance of the first semiconductor structure independent of that of the semiconductor layer. The charge carrier mobility depends on the structure of a material's energy bands and may therefore be influenced by controlling the composition of the semiconductor material of the first semiconductor structure. In that respect, it may be advantageous to use a compound semiconductor such as a binary or ternary III-V or II-VI semiconductor as the material for making the first semiconductor structure.

It shall be noted that the phrase "a higher charge carrier mobility and/or a lower effective charge carrier mass" may relate to at least one sort of different mobile charge carriers that may be present in a given semiconductor material, but not necessarily to all sorts. For instance, it may be possible that the material of the first semiconductor structure has a higher hole mobility than the semiconductor layer, while the electron mobility of the first semiconductor structure material is lower than that of the semiconductor layer.

Additional embodiments relate to a field-effect transistor structure formed on a substrate. The field-effect transistor structure includes a first semiconductor structure formed on the substrates. A gate structure formed above the first semiconductor structure. The gate structure includes a spacer layer terminating the gate structure in a lateral direction of the gate structure. The field-effect transistor also includes a second semiconductor structure formed on the first semiconductor structure and extending in the lateral direction below the spacer layer by less than or equal to the thickness of the spacer layer, and a third semiconductor structure formed above the first semiconductor structure, one of the second and third semiconductor structures forming the source of the field-effect transistor structure and the other one forming the drain of the field-effect transistor structure.

This structure may be formed by a means of an implementation of the method for fabricating a field-effect transistor structure on a substrate.

BRIEF DESCRIPTION OF THE DRAWINGS

These and other features, aspects, and advantages of the embodiments of the disclosure will become better understood with regard to the following description, appended claims, and accompanying drawings where:

While the present disclosure is amenable to various modifications and alternative forms, specifics thereof have been shown by way of example in the drawings and will be described in detail. It should be understood, however, that the intention is not to limit the particular embodiments described. On the contrary, the intention is to cover all modifications, equivalents, and alternatives falling within the scope of the present disclosure. Like reference numerals are used to designate like parts in the accompanying drawings.

DETAILED DESCRIPTION

According to promising results of recent experiments and simulations, a potential for further scaling of field-effect transistors (FETs) regarding dimensions and energy consumption may exist if technological advancements can be made in the field of precise alignment of the source-to-channel junction and the drain-to-channel junction, respectively, to the gate. In the area of tunnel field-effect transistors (TFETs), there may be an additional potential for ease of manufacturing by finding a CMOS-compatible process that allows for manufacturing high-performance TFET devices.

The method for fabricating a field-effect transistor structure on a substrate may utilize any suitable process known from semiconductor microfabrication, including, but not limited to, thin film deposition techniques such as chemical or physical vapor deposition or thermal oxidation, crystal growth techniques such as epitaxy, patterning techniques such as photolithography, and etching techniques such as wet or dry etching, doping techniques such as thermal diffusion or ion implantation, planarization techniques such as chemical-mechanical planarization (CMP), cleaning techniques, wire-bonding techniques, and the like.

The sequence formed by the second semiconductor structure adjoining the first semiconductor structure adjoining or being in an electrically conductive connection with the third semiconductor structure may enable to implement a source-channel-drain structure that is typical for FET devices. In this sequence, the first semiconductor structure may implement a channel structure while the second semiconductor structure may implement either the source structure or the drain structure and the third semiconductor structure may implement the drain structure if the second semiconductor structure was chosen to implement the source structure or the third semiconductor structure may implement the source structure if the second semiconductor structure was chosen to implement the drain structure.

However, it should be noted that designations like "source", "gate" and "drain" denote the intended usage of such sequential semiconductor structure that is to be considered apart from the structure itself. Also, the sequence of the second semiconductor structure adjoining the first semiconductor structure adjoining or being in an electrically conductive connection with the third semiconductor structure may implement any other semiconductor device or microstructure, even if it is not intended to be used as an FET, where it is desirable to have a clear detachment between the second semiconductor structure and the gate-structure equivalent as well as between the third semiconductor structure and the gate-structure equivalent while the first semiconductor structure forms said sequence with the second semiconductor structure and the third semiconductor structure. In this non-FET case, self-alignment may also imply structural control so that the position of the junctions between the first/second and first/third semiconductor can be chosen so as to be either slightly underlapping the gate-structure equivalent or so that they extend laterally beyond the spacer layer and possibly overlap with the gate-structure equivalent.

The FET structure comprises several structural units referred to as "structure" or "structures". These structures may be characterized by a specific material class such as "semiconductor structure", "insulator structure", "metal structure", but it may also be possible that they are characterized by their function, such as in "gate structure". Each of such structural units are to be understood as a volume comprising one or more materials of the specified class, if applicable. For instance, the first semiconductor structure may comprise one, two or more semiconductor materials as specified herein. The boundaries of one such structure, even if it comprises multiple materials, relative to any other adjoining structure are defined by a unity of function for which such structure is designed. In the example given before, the first semiconductor structure may be the channel structure of the FET structure. This does not exclude that the semiconductor layer may contribute to the channel functionality (transport and storage of mobile charge carriers between source and drain) of the first semiconductor structure, i.e., both the first semiconductor structure and the semiconductor layer may participate in storing and/or transporting holes and/or electrons. In another example, the term "gate structure" refers to a heterostructure comprising a conductive gate electrode (e.g., made of a metal) and an insulating barrier and/or a high-k or low-k dielectric layer surrounding the gate electrode and facing the first semiconductor structure.

The present disclosure may refer to the material or material combination used to form the first/second/third semiconductor structure as the first/second/third semiconductor material, respectively; the material or material combination used to form the replacement gate as the placeholder material; and the material or material combination used to form the gate structure as the gate material.

Each semiconductor structure may be made of a pure (undoped) semiconductor, an intrinsic semiconductor (i-type, doped or undoped, having an equal number of excited electrons, n, and holes, p), or a doped semiconductor (having a dopant concentration of $10^{18}$ cm$^{-3}$ or less, while degenerately doped semiconductors with dopant concentrations exceeding $10^{18}$ cm$^{-3}$ are also permissible). Each insulating (non-conducting) structure may be made of a material whose electrical conductivity cannot be increased using technologies such as doping or gating. In this sense, semiconductor materials differing only by their dopant species or dopant concentration are to be considered as different materials. For instance, the compositions of the first semiconductor structure and the third semiconductor structure may comprise the same pure semiconductor as their respective most abundant material, but the first semiconductor structure and the third semiconductor structure may differ in their dopant material or dopant concentration, and hence they are made of different semiconductor materials. Two or all of the first, second and third semiconductor materials may share an equal most abundant material. Without limitation, any insulating structure disclosed herein may be made of an oxide.

The gate structure may comprise a gate electrode made of a conducting material such as titanium nitride (TiN) or a metal such a tungsten (W). The gate structure may further comprise a gate insulator that is made of a gate insulator material and interfaces the gate electrode and at least the first semiconductor structure or, if applicable, the semiconductor layer. The gate insulator material may be, without limitation, an oxide such as aluminum oxide ($Al_2O_3$) or a high-k dielectric such as hafnium dioxide ($HfO_2$).

The term "exposed surface" to a surface that is not covered by material in a given fabrication stage. The exposed surface can be partially or fully covered by material during a following fabrication stage. It does not refer to a specific position of the surface.

The term "layer" does not necessarily imply that the material forming the layer is disposed in a planar manner Rather, it describes that, at a given point of the layer, it is possible to define two perpendicular directions, namely an in-layer direction and a normal direction, wherein, starting at the given point, the extension of the layer in the in-layer direction is greater than its extension in the normal direction.

The relative directions used herein to describe spatial arrangements of the structures making up the FET structure are derived from the geometry of the substrate. The substrate is thought of as a structure that is large compared to the FET structure and comprises a planar upper surface upon which the FET structure can be fabricated. A horizontal direction is thus defined as any direction that is parallel to said upper surface, and a vertical direction is perpendicular to said upper surface, and correspondingly, to any of the horizontal directions. The terms "height" and "depth" refer to vertical extensions or dimensions, while the terms "width" and "length" refer to horizontal dimensions.

Moreover, the gate structure is thought of as a longitudinal structure that has a largest, primary overall extension that is large against any locally defined directions perpendicular to the direction locally corresponding to the primary extension. In such local coordinate system, the term "lateral" designates any horizontal direction that is perpendicular to the local primary extension. The term "length" designates an extension or dimension in a lateral direction and the term "width" designates an extension or dimension in the local primary direction.

The term "thickness" refers to any structure having a respectively larger extension in two perpendicular directions than a third extension in a third direction perpendicular to both of said perpendicular directions and denotes a local or overall extension in said third dimension. That is, the term "thickness" is not restricted to a particular direction with respect to the substrate but is defined by the geometry of a particular structure forming or related to the FET structure. For example, the first semiconductor structure may have its thickness oriented in a vertical direction, while the spacer layer may have its thickness oriented in a lateral direction.

The terms "on" or "covering" are understood herein as a special case of the preposition "above". A structure being on or covering another structure is forming a vertical arrangement with the other structure (i.e., it is above the other structure and the other structure is below the given structure) and adjoining, i.e., contacting, the other structure. A structure above another structure is also forming a vertical arrangement with the other structure but may be located at a vertical distance to the other structure. Likewise, a structure below another structure is forming a vertical arrangement with the other structure but may be located at a vertical distance to the other structure, while a structure being covered by or carrying another structure is adjoining the other structure.

The phrase "removing a structure" may imply that any structures not to be removed may have to be protected by a protecting structure such as a mask layer made of developed photoresist. However, it may also be possible to remove a structure without needing to protect further structures if the material to be removed is selective to the removing agent (e.g., a particular etchant) while the other structures are inert to that agent. An inert material is defined herein as a material with a negligible etch rate in response to contact with a specific etchant, wherein the etch rate is defined as negligible if the overall effect of all treatments of said material with the specific etchant taking place during the manufacturing of the FET structure result in a removal of less than one half monolayer of said material. The term "etchant" may refer to any liquid, gas or plasma adapted for pressureless removal of atoms from the solid phase, or more generally, to the corrosive action of any technique combining such corrosive liquids, gases and/or plasmas.

One of the second and third semiconductor structure is forming the source of the FET structure and the other one of the second and third semiconductor structure is forming the drain of the FET structure. This implies that the second semiconductor structure and the third semiconductor structure are formed on different sides of the gate structure in a given lateral direction. They do not adjoin each other because the device's design as a field-effect transistor structure implies that there is a channel region below the gate. This holds even if the undercut is formed on both sides of the gate structure because it does not extend laterally beyond the thickness of the respective spacer layer segment of the gate structure. This also implies that the opposing spacer layer segments do not adjoin each other.

According to embodiments, the first semiconductor structure is made of silicon and the semiconductor layer is made of silicon-germanium, or the first semiconductor structure and the semiconductor layer are made of different compound semiconductors. Silicon-germanium (SiGe) may feature an improved compatibility (such as a lower interface trap density $D_{IT}$) to many gate materials, including common high-k dielectrics such as hafnium dioxide ($HfO_2$) or nitrided hafnium silicates (HfSiON). Moreover, the combination of silicon (Si) with SiGe may readily be integrated into or make use of existing manufacturing infrastructure, i.e., none or merely a small number of machines and processes (as compared to the total number of machines and processes needed for manufacturing the FET structure) may have to be modified, exchanged or added to implement the formation of a SiGe semiconductor layer as compared to an FET structure formed without the semiconductor layer.

Without limitation, compound semiconductors may include binary or ternary III-V and/or II-VI semiconductors. A high compatibility between the semiconductor layer and the second semiconductor structure may be achieved by fabricating the semiconductor layer and the first semiconductor structure from compound semiconductors of the same class, e.g. both materials selected from the class of III-V semiconductors, and/or ensuring that at least one atomic species of the compound used for the first semiconductor structure is present in the semiconductor layer as well. An advantage of using compound semiconductors may be that their composition of the two or more constituent atomic species may be chosen. In an example, it may be possible to manufacture a structure of indium gallium arsenide (InGaAs) with the variable x in the formula $In_{1-x}Ga_xAs$ set to a desired value. In this way, the statistical distribution of atoms on available lattice positions may be influenced, and it may thus be possible to realize energy bands of a desired structure in a band diagram. In turn, this may be used to realize a compound semiconductor with a desired band gap and/or to control certain properties like mobility and/or tunneling behavior of charge carriers that depend on the particular form of the energy bands.

A non-exhaustive list of possible combinations of compound semiconductors (where the material recommended for the first semiconductor structure is given to the left of the slash and that for the semiconductor layer is given to the right, and an etchant recommended for forming the undercut by selectively removing the first semiconductor structure given in parentheses) includes:

InGaAs/InP ($HCl:H_2O$)
InAs/InGaAs (Citric acid)
InAs/InP (Citric acid)
GaSb/InGaAs (Citric acid)
GaSb/InP (Citric acid)

According to embodiments, the method for fabricating a field-effect transistor structure on a substrate further includes forming a replacement gate structure above the first semiconductor structure, the replacement gate structure comprising a replacement gate and the spacer layer, the spacer layer terminating the replacement gate structure in the lateral direction, removing the replacement gate, thus forming a gate cavity, and forming the gate structure by filling the gate cavity with a gate electrode structure, the gate electrode structure comprising an electrically conductive gate electrode.

The replacement gate structure may allow for a self-aligned, non-overlapping positioning of the junction of the second semiconductor structure relative to the gate structure to be formed at a later point. The gate structure may comprise, e.g., thermally sensitive materials and/or structures that may be adversely affected by any manufacturing steps that follow the formation of the undercut and involve substantial changes of temperature. A separation of the formation of the replacement gate structure from the final gate structure in time may thus allow for forming the gate structure after all potentially adverse manufacturing steps have been completed.

It may be possible to remove the replacement gate by selecting the placeholder material forming the replacement gate such that it allows for a selective response to etching without further protective measures for the surrounding structures. This effect may be achieved by means of chemistry (i.e., only the placeholder material may react to a specifically chosen etchant while all other materials exposed to the etchant do not react with the etchant) or by concentration (the placeholder material may respond to a lower concentration of a given etchant than all other materials exposed to the etchant, or the placeholder material may respond to the etchant by a higher etch rate than the other materials used). In this case, the etching behavior of the placeholder material may allow for a sole removal of the replacement gate while any other structures of the FET structure formed so far remain substantially intact so that the removal of the replacement gate does not deteriorate their respective functions. Without limitation, the placeholder material may be polysilicon, silicon dioxide ($SiO_2$) or silicon nitride (SiN), or more generally, any other oxide, insulating, or organic material.

According to embodiments, the method for fabricating a field-effect transistor structure on a substrate further comprises covering at least the second and third semiconductor structures with an insulator layer, the replacement gate being removed as a result of planarizing the insulator layer using a corrosive substance, the spacer layer having a lower etch rate than the replacement gate in response to the corrosive substance. An exemplary planarization technique is chemical-mechanical polishing (CMP), where the corrosive substance is the carrier liquid of a slurry containing abrasive particles with which the surface to be planarized is recessed. The insulator layer may stabilize the gate structure during the planarization and protect the covered structures from the abrasive and/or corrosive effects of the planarizing process.

Usually, insulator layer can be regarded as having a lower etch rate with respect to the corrosive substance than the replacement gate. Furthermore, the spacer layer of the gate structure is inert to the corrosive substance as defined herein, so the removal of the spacer layer may be confined abrasive removal off the planarized surface. As a result, the corrosive substance may selectively remove the replacement gate faster than the surrounding insulator layer. It may be beneficial to increase the corrosive concentration and/or, where applicable, reduce the number of abrasive particles to intensify this effect.

According to embodiments, the replacement gate is removed by photolithographic patterning and etching. This may enable a removal of the replacement gate without covering the second and third semiconductor structures with an insulator layer. Instead, selectivity of removal may be achieved by covering the structure with a thin photoresist film that is patterned and developed to form a mask layer and removed from the replacement gate structure, and subsequently removing the replacement gate by etching and, optionally, partially or entirely forming the gate structure immediately after the removal while the mask layer is still present. The mask layer may be removed by a known procedure without affecting the structures formed so far. In this way, it may be possible to form additional structures or modify existing structures after the removal of the replacement gate, or respectively, after partially or entirely finishing the gate structure.

According to embodiments, the gate structure comprises an electrically conductive gate electrode and a high-k dielectric layer adjoining the gate electrode in the direction of the first semiconductor structure. The use of a dielectric with a larger dielectric constant than κ=3.9 of silicon dioxide ("high-k dielectric") may reduce charge carrier loss from the first semiconductor structure and/or the semiconductor layer by tunneling, while the use of a conductive gate electrode may reduce the dependence of the FET's switching speed on phononic excitations of the high-k dielectric. This may allow for realizing an FET device implementing the FET structure with higher "on" currents and lower "off" currents and may thus enable a dimensional downscaling of the FET structure beyond the limits of FET structures with a polysilicon gate.

The conductive gate material may comprise a metal or any non-metallic material with a comparably high electric conductivity such as a doped semiconductor or a conductive ceramic like indium tin oxide (ITO). The gate structure may comprise further structures such as a layer of a material having a desired work function and interfacing the high-k dielectric and the gate electrode.

According to embodiments, the spacer layer comprises two spacer layer segments terminating the gate structure on two opposite sides in the lateral direction, the first exposed surface comprising two exposed surface segments separated by the gate structure, the formation of the undercut resulting in forming the undercut below each spacer layer segment, the third semiconductor structure being formed on the recessed first semiconductor structure and filling the undercut.

This may allow for undercutting the gate structure on both of its laterally opposite sides without creating an overlap with the internal gate structures that are covered by the spacer layer segments. Thus, both the second and the third semiconductor structure, i.e., both the source and the drain of the FET structure, may comprise a portion that extends vertically into the first semiconductor structure and laterally below the spacer layer segments This may reduce the access resistance of the FET structure and may thus contribute to a reduction of its "off" current.

According to embodiments, the substrate comprises a bulk substrate and an insulating base layer covering the bulk substrate, the first semiconductor structure being formed on the base layer. This may result in a reduced leakage of charge carriers from the first semiconductor structure via the substrate. Without limitation, the base layer may be a buried oxide ("BOX") and/or may be formed by manipulating (e.g., oxidizing) the surface of the substrate or by newly forming (e.g., deposing or growing) the base layer on the substrate.

According to embodiments, the first semiconductor structure adjoins the bulk substrate. This may allow for using the bulk substrate as a back-gate contact so the first semiconductor structure may be simultaneously biased either by an identical voltage from two sides (i.e., a gate electrode of the gate structure and the back-gate contact having applied the same voltage) or by controlling the back-gate voltage independent of the voltage applied to the gate. In this way, the control over mobile charge carriers present in the first semiconductor structure may be improved and it may become possible to store a larger number of charge carriers in the volume of the first semiconductor structure.

According to embodiments, the spacer layer is inert to the etchant. This may ensure that the thickness of the spacer layer is preserved during the formation of the undercut and may thus ensure that the lateral distance between the second semiconductor structure and the gate structure does not go below a desired minimum distance. This may enable an improved control of the electrostatic interaction between the second semiconductor structure and the gate structure.

According to embodiments, the extent of the undercut is related to the thickness of the spacer layer remaining after completion of the etching process using the etchant. The lateral extension of the undercut below the spacer layer is defined to be less than or equal to the thickness of the spacer layer. By referring to the thickness of the spacer layer remaining after completion of the etching process using the etchant, it may be ensured that the formation of the undercut is finished before exceeding the interface between the spacer layer and the portion of the gate structure covered by the spacer layer, and thus an overlap between the second semiconductor structure and said portion of the gate structure may be avoided.

According to embodiments, the first semiconductor structure comprises an intrinsic semiconductor, the second semiconductor structure comprising a p-type semiconductor, the third semiconductor structure comprising an n-type semiconductor; or the first semiconductor structure comprises an intrinsic semiconductor, the second semiconductor structure comprising an n-type semiconductor, the third semiconductor structure comprising a p-type semiconductor. In both cases, this may result in the FET structure implementing a tunnel field-effect transistor (TFET) structure. In this case, it may be possible to reach a subthreshold slope well below the classical limit of 60 mV/dec, which may result in a higher switching speed as well as a lower power consumption than would be possible with a MOSFET implementing thermal charge carrier generation.

According to embodiments, the gate structure comprises a gate electrode, the method for fabricating a field-effect transistor structure on a substrate further includes covering the field-effect transistor structure with an insulator layer, the insulator layer extending vertically up to a reference plane, starting from the reference plane, forming a first, a second and a third contact cavity, the first contact cavity exposing a portion of the gate electrode, the second contact cavity exposing a portion of the second semiconductor structure, the third contact cavity exposing a portion of the third semiconductor structure, the insulator layer detaching the second and third contact cavities from the gate structure, and filling the first, the second and the third contact cavity with a conductive material up to the reference plane, the conductive material electrically contacting the respective exposed portion.

This approach to forming contacting structures to the second and third semiconductor structures and the gate structure may make an efficient use of the available space for contacting and may feature a comparably low complexity of manufacturing. For instance, the contact cavities may be formed by lithographical patterning and subsequent etching. The step of filling the contact cavities may include overfilling one or more of the contact cavities, optionally followed by a planarization step. The conductive material may comprise a metal or any non-metallic material with a comparably high electric conductivity such as a doped semiconductor or a conductive ceramic like indium tin oxide (ITO).

According to embodiments, the formation of the undercut is performed by means of digital etching. This technique typically involves an alternating application of an oxidizing agent (e.g., ozone, $O_2$ plasma, or an electron beam) and a corrosive chemical (e.g., hydrochloric acid or chlorine gas) and may enable a removal of the first semiconductor, starting from the first exposed surface, with nanometer, monolayer, or sub-monolayer precision. In this way, an effective control of the removed amount of first semiconductor may be possible, allowing for stopping the digital etching before the undercut overlaps with the portion of the gate structure that is covered by the spacer layer.

According to embodiments, the gate structure has a lateral extension of 10 to 500 nanometers measured at the boundary of the gate structure facing the first semiconductor structure and/or the second semiconductor structure has a largest vertical extension of 30 to 50 nanometers, and/or the first semiconductor structure has a largest vertical extension of 10 to 20 nanometers, and/or the first semiconductor structure has a largest lateral extension of 500 to 1500 nanometers.

The given dimensional ranges may be small enough to warrant the effort of implementing the method in favor of conventional simpler methods where scaling constraints such as additional quantum effects are negligible and may be large enough that each structure making up the FET structure may be manufactured using known manufacturing methods such as photolithography, etching and epitaxial growth. The channel length of the FET structure may be defined by the lateral extension of the gate structure less the thickness of the spacer layer (segments). The largest vertical extension of the second semiconductor structure is measured from the recessed surface of the first semiconductor structure and may be interpreted as the raised source/drain thickness of the FET structure. The largest vertical extension of the first semiconductor structure is measured between the substrate (or the base layer, where applicable) and either the gate structure or, if applicable, the semiconductor layer and may be interpreted as the channel thickness. If, however, a semiconductor layer is implemented with the FET structure, it may be possible that the effective channel thickness is larger than the largest vertical extension of the first semiconductor structure if the semiconductor layer contributes to a channel functionality of the first semiconductor structure. The largest lateral extension of the first semiconductor structure may be interpreted as a mesa length of the FET structure and may determine the process size and/or the minimum feature size of the FET structure.

Figure 8:
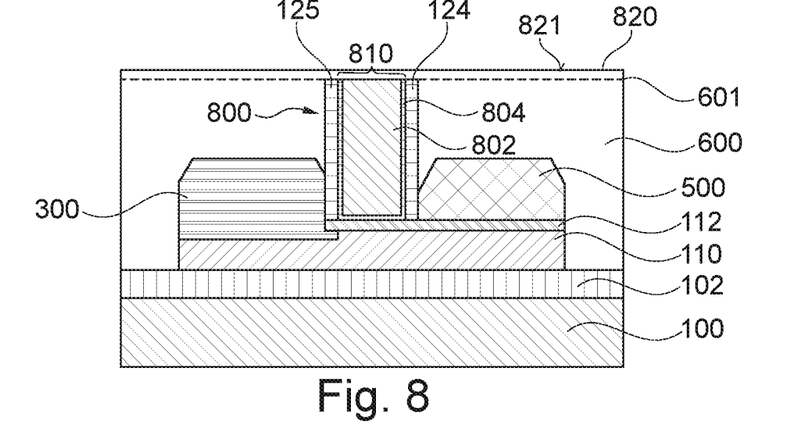
Figure 9:
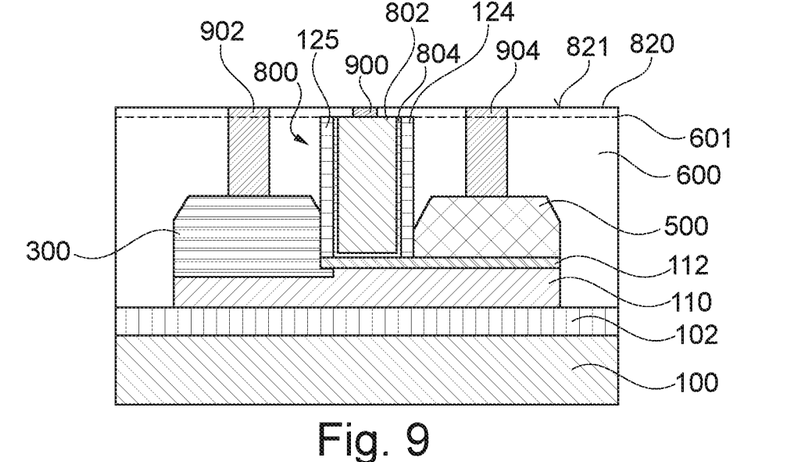
Figure 10:
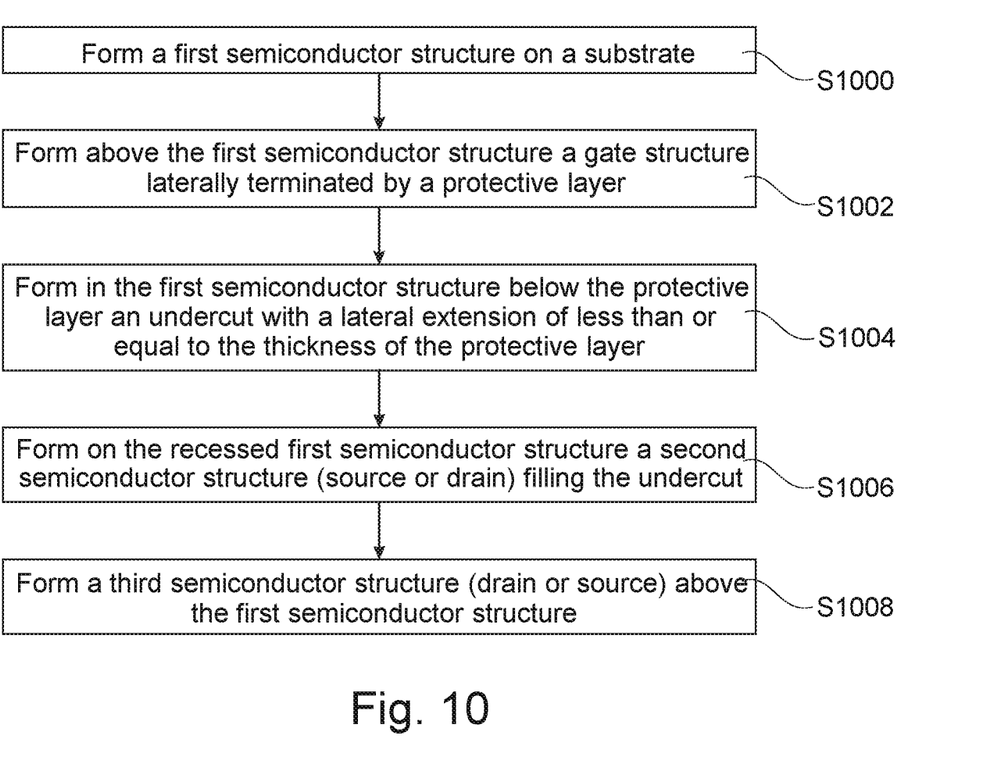
FIG. 10 is a flow chart for fabricating a field-effect transistor structure on a substrate, in accordance with embodiments of the present disclosure.

Referring now to the drawings, FIGS. 1-9 are cross-sectional views of an exemplary field-effect transistor (FET) structure at different subsequent fabrication stages and FIG. 10 visualizes a method for fabricating a field-effect transistor structure on a substrate. Fabrication stages implemented by the method of FIG. 10 are part of the structures shown in FIGS. 1-8.

Figure 1:
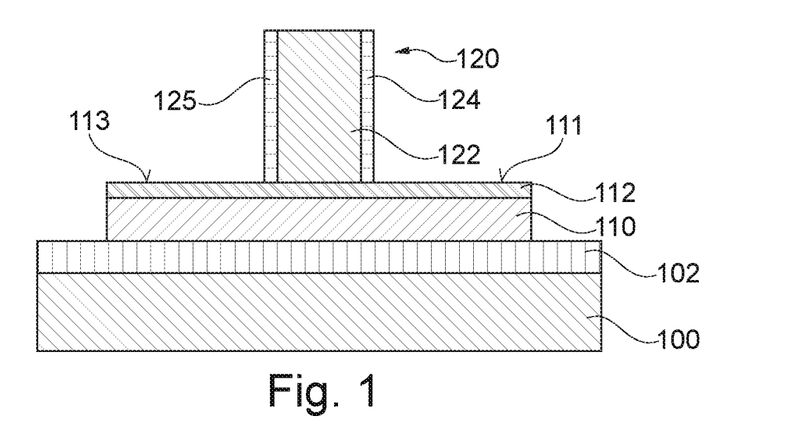
FIGS. 1-5 are cross-sectional views of an exemplary field-effect transistor structure at fabrication stages constructed according to the method of FIG. 10, in accordance with embodiments of the present disclosure.

FIG. 1 illustrates a first semiconductor structure 110 that has been formed on an insulating base layer 102 of a substrate 100, 102. The first semiconductor structure may be made of a doped, an intrinsic or an undoped semiconductor. The first semiconductor structure 110 is covered by a semiconductor layer 112. The semiconductor layer 112 is made of a material that has a lower etch rate, in response to being etched with a predetermined etchant, than the first semiconductor structure 110. A replacement gate structure 120 has been formed on the semiconductor layer 112. The replacement gate structure 120 comprises a replacement gate 122 and two spacer layer segments 124, 125. The replacement gate 122 has a rectangular cross section and is laterally covered by one of the spacer layer segments 124, 125 on each lateral side. The spacer layer segments 124, 125 are inert to the predetermined etchant and have a known thickness that may be identical for both spacer layer segments 124, 125 or different. An exposed layer surface 111 of the semiconductor layer 112 to the right of the replacement gate structure 120 and another exposed layer surface 113 of the semiconductor layer 112 to the left of the replacement gate structure 120 are not covered by the replacement gate structure 120. The right exposed layer surface 111 and the left exposed layer surface 113 are adjoining the right spacer layer segment 124 and the left spacer layer segment 125, respectively.

Without limitation, some or all of the structures of the fabrication stages shown in FIGS. 1-9 may alternatively be formed on the bulk substrate 100 using a deposition technique combined with photolithographic patterning and etching. Without limitation, the bulk substrate 100 may be made of a semiconductor material such as silicon. The optional base layer 102 may be made of a suitable electrical insulator such as an oxide and may be formed by various known methods such as a deposition technique or oxidization of the surface of the bulk substrate 100. The first semiconductor structure 104 may be manufactured by one or more of various suitable processes, including, but not limited to, a formation as part of the bulk substrate 100 and/or the base layer 102 (e.g., silicon-on-insulator, SOI); deposition onto the bulk substrate 100 and/or the base layer 102 by a process such as wafer bonding; or direct growth onto the bulk substrate 100 and/or the base layer 102 by a process such as template-assisted selective epitaxy. It may be possible to form the first semiconductor structure 110 directly on a bulk substrate 100 that is not vertically terminated by an insulating base layer 102. The semiconductor layer 112 may be formed on the first semiconductor structure 110 by known means such as deposition or epitaxial growth.

Moreover, the spacer layer segments 124, 125 do not necessarily have to be inert to the predetermined etchant but must have a lower etch rate than the first semiconductor structure in this case. The usage of the replacement gate 122 is optional; the FET structure may rather be manufactured with a final gate structure such as the gate structure 800 shown in FIG. 8 from the beginning, as long as it comprises at least one spacer layer segment 125 laterally terminating the gate structure 800. The presence of the semiconductor layer 112 is optional; instead, the undercut 200 may be formed below and adjoining the spacer layer segments 124, 125.

The particular geometry of the structures of the fabrication stages shown in FIGS. 1-9 is intended for the sole purpose of illustration. Numerous variations may be possible for each structure without leaving the scope and spirit of the present disclosure. In the example of FIG. 1, the first semiconductor structure 110 does not necessarily have to be formed as a rectangular mesa as depicted. Rather, there is no restriction to the geometry of the first semiconductor structure 110 but that it is formed on the substrate 100, 102 (i.e., on the bulk substrate 100 and/or on the base layer 102) and that the gate structure 800 is formed above the first semiconductor structure and may be separated from the first semiconductor structure 110 by an semiconductor layer 112. In addition, there is no restriction to the geometry of the replacement gate structure 120 but that it at least comprises one spacer layer segment 125 laterally terminating the replacement gate structure 120 on the side facing the to-be-formed second semiconductor structure 300.

Figure 2:
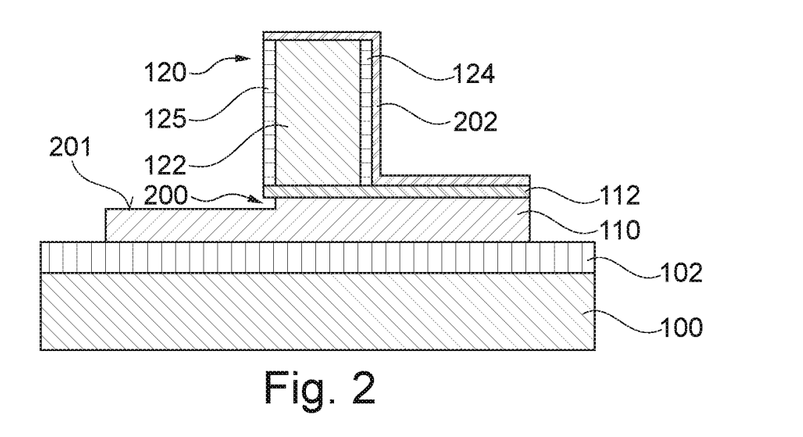

In FIG. 2, a mask layer 202 has been deposited on the replacement gate structure 120, the right exposed layer surface 111, and the right surface of the right spacer layer segment 124. The mask layer 202 has not been formed on the left exposed surface 113 and the left spacer layer segment 125. To the left of the replacement gate structure 120, starting from the left exposed surface 113, the semiconductor layer 112 has been removed, e.g., using an etching technique. By the removal of the semiconductor layer 112, a first exposed surface of the first semiconductor structure (not shown) was exposed. As the left exposed layer surface 113 was initially adjoining the left spacer layer segment 125, the first exposed surface of the first semiconductor structure 110 was aligned with the left surface of the left spacer layer segment 125.

Starting from said first exposed surface, the first semiconductor structure 110 has been recessed by etching using the predetermined etchant (e.g., digital etching). The recess has progressed vertically from the left exposed layer surface 113, and simultaneously, diagonally into the volume of the first semiconductor structure 110 below the left spacer layer segment 125 such that an undercut 200 was formed below the left spacer layer segment 125. In the example of FIG. 2, the recessed depth of the first semiconductor structure 110 as well as the lateral extension of the undercut 200 are equal to the thickness of the left spacer layer segment 125 because the right border of the first exposed surface was aligned with the left spacer layer segment 125. Alternatively, it may be possible to stop the etching process using the predetermined etchant at an earlier point so that the lateral extension of the undercut 200 is smaller than the thickness of the left spacer layer segment 125.

If, in an alternative implementation, the undercut 200 is to be formed under both spacer layer segments 124, 125 and the spacer layer segments 124, 125 have unequal thicknesses, then either the undercuts 200 may be formed subsequently such that the lateral extension of each undercut 200 can be controlled according to the specific thickness of each spacer layer segment 124, 125, or the undercuts 200 may be formed simultaneously with their common lateral extension being less than or equal to the thickness of the thinner spacer layer segment such that an overlap with the replacement gate 122 may be avoided on both sides. In a further alternative implementation, the semiconductor layer 112 is left out and the undercut 200 is formed below and adjoining the left spacer layer segment 125.

Figure 3:
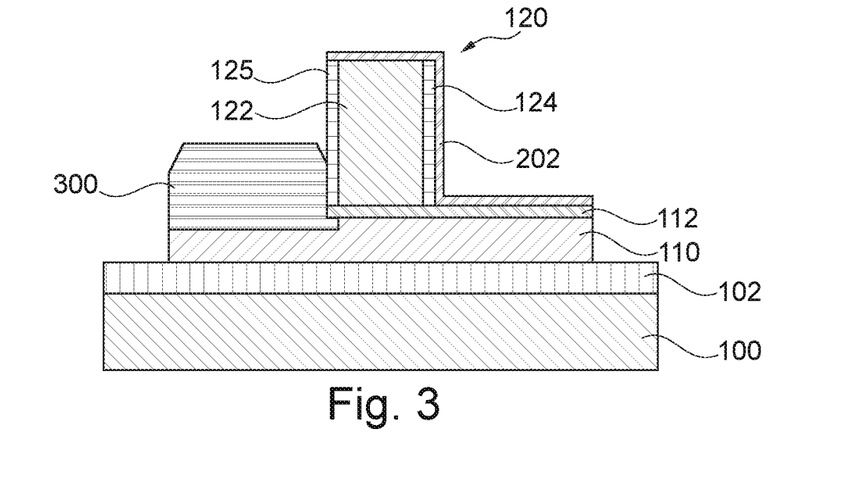

In FIG. 3, a second semiconductor structure 300 has been formed (e.g., by growth or deposition) on the recessed surface 201 of the first semiconductor structure 110. The second semiconductor structure 300 may form the source or drain region of the FET structure and may comprise an n-doped or p-doped semiconductor. The second semiconductor structure 300 fills the undercut 200, is aligned with the left boundary of the mesa formed by the first semiconductor structure 110 and extends vertically up to about half the height of the replacement gate structure 120. Due to the lateral extension of the undercut 200 up to the interface between the left spacer layer segment 125 and the replacement gate 122, the second semiconductor structure 300 is aligned with the left boundary of the replacement gate 122.

Figure 4:
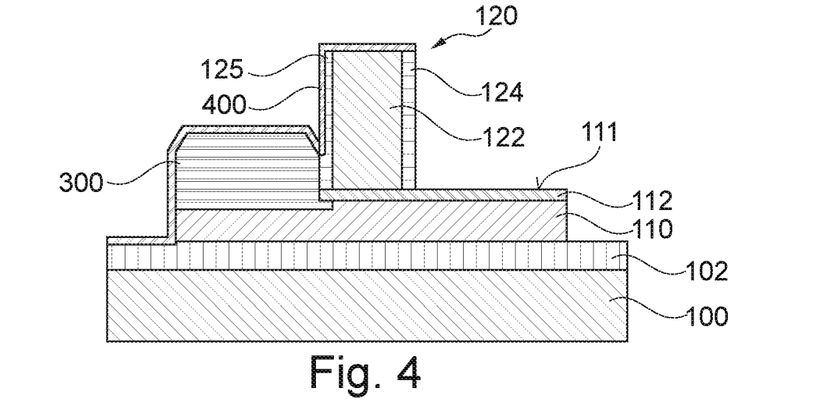

In FIG. 4, the mask layer 202 has been removed and a new mask layer 400 has been formed on the replacement gate structure 120, the left surface of the left spacer layer segment 125 and the second semiconductor structure 300. The mask layer 400 has not been formed on the right surface of the right spacer layer segment 124 and the right exposed layer surface 111.

Figure 5:
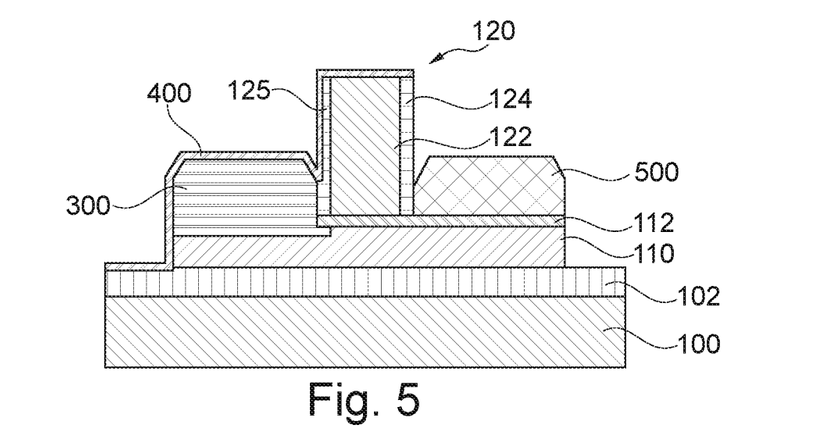

In FIG. 5, a third semiconductor structure 500 has been formed (e.g., by growth or deposition) on the right exposed layer surface 111. The third semiconductor structure 500 may form the drain region of the FET structure if the second semiconductor structure 300 forms its source region, or alternatively, the third semiconductor structure 500 may form the source region of the FET structure if the second semiconductor structure 300 forms its drain region. The third semiconductor structure 500 may comprise an n-doped or p-doped semiconductor. The third semiconductor structure 500 is aligned with the right boundary of the mesa formed by the first semiconductor structure 110 and the semiconductor layer 112 and extends vertically up to the same height reached by the second semiconductor structure 300, i.e., about half the height of the replacement gate structure 120.

Figure 6:
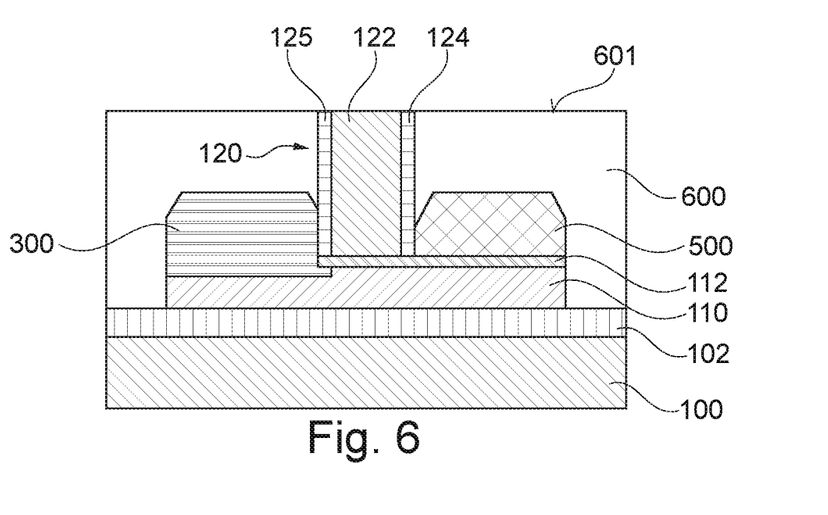
FIGS. 6-9 are cross-sectional views of an exemplary field-effect transistor structure at further fabrication stages, in accordance with embodiments of the present disclosure.

In FIG. 6, the mask layer 400 has been removed and an insulator layer 600 has been formed on the base layer 102, the second semiconductor structure 300 and the third semiconductor structure 500. The insulator layer 600 extends vertically up to a first reference plane 601 that has been formed by common planarization of the replacement gate structure 120 with the insulator layer 600.

Figure 7:
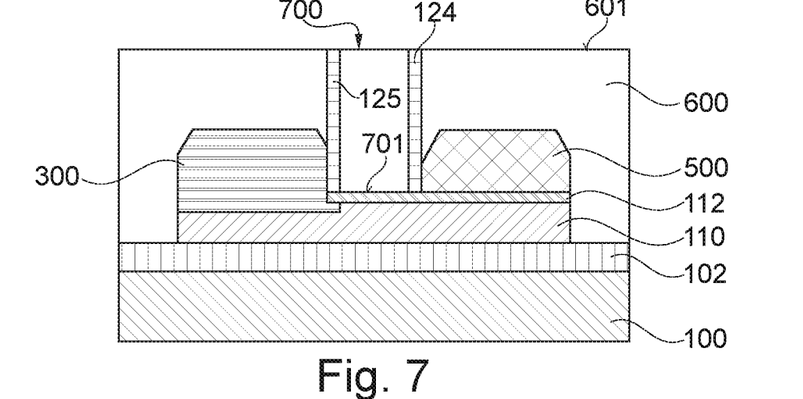

In FIG. 7, the replacement gate 122 has been removed, e.g., by utilizing a wet-etch process. The spacer layer segments 124, 125 are unaffected by the removal (e.g. because they are made of an oxide that is inert to a corrosive substance used for planarizing the first reference plane 601) and now form the lateral boundaries of a gate cavity 700. A gate interface surface 701 of the semiconductor layer 112 forms the bottom of the gate cavity 700. In an alternative implementation, the replacement gate 122 may be removed by a planarization technique applied to the first reference plane 601. In another alternative implementation, the replacement gate 122 may be removed without covering the structures formed so far by an insulator layer 600, but rather by photolithographic patterning (involving a further mask layer not depicted) and etching.

In FIG. 8, the gate cavity 700 has been filled with a gate electrode structure 810 up to the first reference plane 601. The gate electrode structure 810 and the two spacer layer segments 124, 125 laterally adjoining the gate electrode structure 810 form the gate structure 800. The gate electrode structure 810 comprises a gate electrode 802 and a high-k dielectric layer 804 laterally interfacing the gate electrode 802 toward the spacer layer segments 124, 125 and vertically interfacing the gate electrode 802 toward the semiconductor layer 112. The first reference plane 601 has been covered by a further insulator layer 820 that extends vertically up to a second reference plane 821.

It shall be noted that the particular design of the gate electrode structure 810 is shown in FIG. 8 for the sole purpose of illustration. In general, the gate electrode structure 810 comprises at least the gate electrode 802 that is made of an electrically conductive material, e.g., a metal, a doped semiconductor or a conductive ceramic like indium tin oxide (ITO). That is, the high-k dielectric layer 804 shown in FIG. 8 is optional. On the other hand, the gate electrode structure 810 may comprise further structures not shown in the drawing, such as a layer made of a metal with a desired work function interfacing the gate electrode 802 and the high-k dielectric layer 804.

FIG. 9 is a cross-sectional view of the exemplary field-effect transistor structure at a further fabrication stage that goes beyond the fabrication of the FET structure. In FIG. 9, the FET structure comprises vias 900, 902, 904 that are made of a metal or another electrically conductive material filling out contact cavities. Via 900 extends between the second reference plane 821 and the gate electrode 802 and is adapted for electrically contacting the gate electrode 802 from the second reference plane 821, via 902 extends between the second reference plane 821 and the second semiconductor structure 300 and is adapted for electrically contacting the second semiconductor structure 300 from the second reference plane 821, and via 904 extends between the second reference plane 821 and the third semiconductor structure 500 and is adapted for electrically contacting the third semiconductor structure 500 from the second reference plane 821. The insulator layer 600 separates via 902 from the left spacer layer segment 125 and separates via 904 from the right spacer layer segment 124. In an alternative FET structure formed without a right spacer layer segment 124, the insulator layer 600 would separate the via 904 from the right boundary of the gate electrode structure 810.

FIG. 10 is a flow diagram visualizing an exemplary method for fabricating a field-effect transistor structure on a substrate 100, 102. The method starts with forming S1000 a first semiconductor structure 110 on the substrate 100, 102. Depending on the type of FET device to be implemented by the FET structure, the first semiconductor structure 110 may be made of a pure, a doped or an intrinsic semiconductor. In step S1002, a gate structure 800 is formed above the first semiconductor structure 110. The gate structure 800 may be formed in a gate-first or a gate-last process on the first semiconductor structure 110 or on a semiconductor layer 112 covering the first semiconductor structure 110. The gate structure 800 is laterally terminated by a spacer layer segment 125 that has a lower etch rate in response to being etched by a predetermined etchant than the material forming the first semiconductor structure 110.

In step S1004, an undercut 200 is formed in the first semiconductor structure below the spacer layer 125. The undercut 200 may be formed by means of a high-precision etch process, e.g. digital etching, that uses the predetermined etchant. The formation of the undercut 200 is controlled such that its lateral extension into the first semiconductor structure 110 is less than or equal to the thickness of the spacer layer 125. This dimensioning constraint is affected by the combination of the high-precision etch process with the lower etch rate of the spacer layer 125.

In step S1006, the undercut 200 is filled by a second semiconductor structure 300 that is formed on the recessed surface 201 of the first semiconductor structure 110. The second semiconductor structure 300 may form ether the source or the drain of the FET structure. As the lateral extension of the undercut 200 is less than or equal to the thickness of the spacer layer 125, an overlap between the second semiconductor structure and the portion of the gate structure 800 that is covered by the spacer layer 125 (e.g., a gate electrode 802) may be avoided. In step 1008, a third semiconductor structure 500 is formed above the first semiconductor structure 110 such that it may form the drain of the FET structure of the second semiconductor structure 300 forms its source, or such that it may form the source of the FET structure if the second semiconductor structure 300 forms its drain. This may be done by separating the second semiconductor structure 300 and the third semiconductor structure 500 by the gate structure 800. Depending on their desired function as either source of drain, the second semiconductor structure 300 and the third semiconductor structure 500 may be p-type or n-type semiconductors. The FET structure formed this way may be subject to additional processing, such as contacting of the second semiconductor structure 300, the gate structure 800 and the third semiconductor structure 500, to form a fully integrated FET device.

In the following, the invention will be described again by a list of clauses highlighting several possible, non-exclusive combinations of features disclosed herein:

1. A method for fabricating a field-effect transistor structure on a substrate, the method comprising:
   forming a first semiconductor structure on the substrate;
   forming a gate structure above the first semiconductor structure, the gate structure comprising a spacer layer terminating the gate structure in a lateral direction of the gate structure, the spacer layer having a lower etch rate than the first semiconductor structure in response to being etched with a predetermined etchant, a first exposed surface of the first semiconductor structure being uncovered by the gate structure;
   starting from the first exposed surface, forming an undercut below the spacer layer by recessing the first semiconductor structure using the etchant, the undercut extending in the lateral direction below the spacer layer by less than or equal to the thickness of the spacer layer;
   forming on the recessed first semiconductor structure a second semiconductor structure filling the undercut; and
   forming a third semiconductor structure above the first semiconductor structure, one of the second and third semiconductor structures forming the source of the field-effect transistor structure and the other one forming the drain of the field-effect transistor structure.

2. The method of clause 1, further comprising:
   covering the first semiconductor structure with a semiconductor layer, the semiconductor layer having a lower etch rate than the first semiconductor structure in response to being etched with the etchant, the gate structure being formed on the semiconductor layer; and
   exposing the first exposed surface by removing a portion of the semiconductor layer uncovered by the gate structure.

3. The method of clause 2, the semiconductor layer having a lower interface trap density with respect to the gate structure than the first semiconductor structure.

4. The method of clause 2 or 3, the first semiconductor structure having a higher charge carrier mobility and/or a lower effective charge carrier mass than the semiconductor layer.

5. The method of any of clauses 2 to 4, the first semiconductor structure being made of silicon and the semiconductor layer being made of silicon-germanium, or the first semiconductor structure and the semiconductor layer being made of different compound semiconductors.

6. The method of any of the previous clauses, further comprising:
   forming a replacement gate structure above the first semiconductor structure, the replacement gate structure comprising a replacement gate and the spacer layer, the spacer layer terminating the replacement gate structure in the lateral direction;
   removing the replacement gate, thus forming a gate cavity; and
   forming the gate structure by filling the gate cavity with a gate electrode structure, the gate electrode structure comprising an electrically conductive gate electrode.
7. The method of clause 6, further comprising covering at least the second and third semiconductor structures with an insulator layer, the replacement gate being removed as a result of planarizing the insulator layer using a corrosive substance, the spacer layer having a lower etch rate than the replacement gate in response to the corrosive substance.
8. The method of clause 6, the replacement gate being removed by photolithographic patterning and etching.
9. The method of any of the previous clauses, the gate structure comprising an electrically conductive gate electrode and a high-k dielectric layer adjoining the gate electrode in the direction of the first semiconductor structure.
10. The method of any of the previous clauses, the spacer layer comprising two spacer layer segments terminating the gate structure on two opposite sides in the lateral direction, the first exposed surface comprising two exposed surface segments separated by the gate structure, the formation of the undercut resulting in forming the undercut below each spacer layer segment, the third semiconductor structure being formed on the recessed first semiconductor structure and filling the undercut.
11. The method of any of the previous clauses, the substrate comprising a bulk substrate and an insulating base layer covering the bulk substrate, the first semiconductor structure being formed on the base layer.
12. The method of clause 11, the first semiconductor structure adjoining the bulk substrate.
13. The method of any of the previous clauses, the spacer layer being inert to the etchant.
14. The method of any of the previous clauses, wherein the extent of the undercut is related to the thickness of the spacer layer remaining after completion of the etching process using the etchant.
15. The method of any of the previous clauses, the first semiconductor structure comprising an intrinsic semiconductor, the second semiconductor structure comprising a p-type semiconductor, the third semiconductor structure comprising an n-type semiconductor; or
   the first semiconductor structure comprising an intrinsic semiconductor, the second semiconductor structure comprising an n-type semiconductor, the third semiconductor structure comprising a p-type semiconductor.
16. The method of any of the previous clauses, the gate structure comprising a gate electrode, the method further comprising:
   covering the field-effect transistor structure with an insulator layer, the insulator layer extending vertically up to a reference plane;
   starting from the reference plane, forming a first, a second and a third contact cavity, the first contact cavity exposing a portion of the gate electrode, the second contact cavity exposing a portion of the second semiconductor structure, the third contact cavity exposing a portion of the third semiconductor structure, the insulator layer detaching the second and third contact cavities from the gate structure; and
   filling the first, the second and the third contact cavity with a conductive material up to the reference plane, the conductive material electrically contacting the respective exposed portion.
17. The method of any of the previous clauses, the formation of the undercut being performed by means of digital etching.
18. The method of any of the previous clauses, the gate structure having a lateral extension of 10 to 500 nanometers measured at the boundary of the gate structure facing the first semiconductor structure; and/or
   the second semiconductor structure having a largest vertical extension of 30 to 50 nanometers; and/or
   the first semiconductor structure having a largest vertical extension of 10 to 20 nanometers; and/or
   the first semiconductor structure having a largest lateral extension of 500 to 1500 nanometers.
19. A field-effect transistor structure formed on a substrate, the field-effect transistor structure comprising:
   a first semiconductor structure formed on the substrate;
   a gate structure formed above the first semiconductor structure, the gate structure comprising a spacer layer terminating the gate structure in a lateral direction of the gate structure;
   a second semiconductor structure formed on the first semiconductor structure and extending in the lateral direction below the spacer layer by less than or equal to the thickness of the spacer layer; and
   a third semiconductor structure formed above the first semiconductor structure, one of the second and third semiconductor structures forming the source of the field-effect transistor structure and the other one forming the drain of the field-effect transistor structure.

What is claimed is:
1. A method for fabricating a field-effect transistor structure on a substrate, the method comprising:
   forming a first semiconductor structure on the substrate;
   forming a gate structure above the first semiconductor structure, the gate structure comprising spacer layer segments with unequal thickness terminating the gate structure in a lateral direction of the gate structure, the spacer layer segments having a lower etch rate than the first semiconductor structure in response to being etched with a predetermined etchant, a first exposed surface of the first semiconductor structure being uncovered by the gate structure;
   starting from the first exposed surface, forming an undercut below both of the spacer layer segments by recessing the first semiconductor structure using the etchant, the undercut extending in the lateral direction below the spacer layer segments by less than or equal to a thickness of the spacer layer segments;
   forming on the recessed first semiconductor structure a second semiconductor structure filling the undercut, wherein an overlap between the second semiconductor structure and a portion of the gate structure that is covered by the spacer layer segments is avoided; and
   forming a third semiconductor structure above the first semiconductor structure, one of the second semiconductor structure and the third semiconductor structure forming a source of the field-effect transistor structure and the other one forming a drain of the field-effect transistor structure, wherein a laterally outer boundary of the third semiconductor structure terminates at or within an uppermost portion of a laterally outer boundary of a mesa formed by the first semiconductor structure, the spacer layer segments including two spacer layer segments terminating the gate structure on two opposite sides in the lateral direction, the first exposed surface comprising two exposed surface segments separated by the gate structure, the third semiconductor structure being formed on the recessed first semiconductor structure.

2. The method of claim 1, further comprising:
covering the first semiconductor structure with a semiconductor layer, the semiconductor layer having a lower etch rate than the first semiconductor structure in response to being etched with the etchant, the gate structure being formed on the semiconductor layer; and
exposing the first exposed surface by removing a portion of the semiconductor layer uncovered by the gate structure.

3. The method of claim 2, the semiconductor layer having a lower interface trap density with respect to the gate structure than the first semiconductor structure.

4. The method of claim 2, the first semiconductor structure having a higher charge carrier mobility and/or a lower effective charge carrier mass than the semiconductor layer.

5. The method of claim 2, the first semiconductor structure being made of silicon and the semiconductor layer being made of silicon-germanium, or the first semiconductor structure and the semiconductor layer being made of different compound semiconductors.

6. The method of claim 1, further comprising:
forming a replacement gate structure above the first semiconductor structure, the replacement gate structure comprising a replacement gate and the spacer layer, the spacer layer terminating the replacement gate structure in the lateral direction;
removing the replacement gate, thus forming a gate cavity; and
forming the gate structure by filling the gate cavity with a gate electrode structure, the gate electrode structure comprising an electrically conductive gate electrode.

7. The method of claim 6, further comprising covering at least the second and third semiconductor structures with an insulator layer, the replacement gate being removed as a result of planarizing the insulator layer using a corrosive substance, the spacer layer having a lower etch rate than the replacement gate in response to the corrosive substance.

8. The method of claim 6, the replacement gate being removed by photolithographic patterning and etching.

9. The method of claim 1, the gate structure comprising an electrically conductive gate electrode and a high-k dielectric layer adjoining the gate electrode in the lateral direction of the first semiconductor structure.

10. The method of claim 1, the substrate comprising a bulk substrate and an insulating base layer covering the bulk substrate, the first semiconductor structure being wholly formed on the insulating base layer.

11. The method of claim 1, the spacer layer being inert to the etchant.

12. The method of claim 1, wherein an extent of the undercut is related to the thickness of the spacer layer remaining after completion of an etching process using the etchant.

13. The method of claim 1, wherein the first semiconductor structure comprises an intrinsic semiconductor, the second semiconductor structure comprises a p-type semiconductor, and the third semiconductor structure comprises an n-type semiconductor.

14. The method of claim 1, the gate structure comprising a gate electrode, the method further comprising:
covering the field-effect transistor structure with an insulator layer, the insulator layer extending vertically up to a reference plane;
starting from the reference plane, forming a first, a second and a third contact cavity, the first contact cavity exposing a portion of the gate electrode, the second contact cavity exposing a portion of the second semiconductor structure, the third contact cavity exposing a portion of the third semiconductor structure, the insulator layer detaching the second and third contact cavities from the gate structure; and
filling the first, the second and the third contact cavity with a conductive material up to the reference plane, the conductive material electrically contacting the respective exposed portion.

15. The method of claim 1, the formation of the undercut being performed by means of digital etching.

16. The method of claim 1, the gate structure having a lateral extension of 10 to 500 nanometers measured at a boundary of the gate structure facing the first semiconductor structure; and/or
the second semiconductor structure having a largest vertical extension of 30 to 50 nanometers; and/or
the first semiconductor structure having a largest vertical extension of 10 to 20 nanometers; and/or
the first semiconductor structure having a largest lateral extension of 500 to 1500 nanometers.

17. The method of claim 2, wherein the semiconductor layer terminates with the laterally outer boundary of the mesa formed by the first semiconductor structure.

* * * * *